United States Patent
Nguyen et al.

(10) Patent No.: US 6,670,266 B2
(45) Date of Patent: Dec. 30, 2003

(54) MULTILAYERED DIFFUSION BARRIER STRUCTURE FOR IMPROVING ADHESION PROPERTY

(75) Inventors: Tue Nguyen, Fremont, CA (US); Tai Dung Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 10/292,929

(22) Filed: Nov. 13, 2002

(65) Prior Publication Data

US 2003/0073301 A1 Apr. 17, 2003

Related U.S. Application Data

(63) Continuation-in-part of application No. 09/520,107, filed on Mar. 7, 2000, now Pat. No. 6,495,449.

(51) Int. Cl.[7] .......................................... H01L 21/4763
(52) U.S. Cl. ...................... 438/627; 438/644; 438/654; 438/769
(58) Field of Search ................................ 438/627, 642, 438/643, 644, 654, 648, 649, 682, 683, 685, 769, 770, 775

(56) References Cited

U.S. PATENT DOCUMENTS

| | | | | |
|---|---|---|---|---|
| 5,654,245 A | * | 8/1997 | Allen | 438/629 |
| 5,780,346 A | * | 7/1998 | Arghavani et al. | 438/775 |
| 5,909,637 A | * | 6/1999 | Charneski et al. | 438/687 |
| 5,913,144 A | * | 6/1999 | Nguyen et al. | 438/643 |
| 6,261,925 B1 | * | 7/2001 | Arghavani et al. | 438/775 |

* cited by examiner

*Primary Examiner*—Kevin M. Picardat
(74) *Attorney, Agent, or Firm*—Tue Nguyen

(57) ABSTRACT

A method has been provided for improving the adhesion of copper to a nitrided metal diffusion barrier material, such as TiN, in an integrated circuit substrate. The method provided a multilayered diffusion barrier structure, comprising a conducting diffusion barrier layer and a poorly conducting adhesion-promoter layer in selected locations. The formation of a poorly conducting adhesion-promoter layer in selected locations permits the optimization of both contact resistance and adhesion property. The poorly conducting adhesion-promoter layer is formed either by the partial incorporation of oxygen into the diffusion barrier or by deposition in an oxygen ambient.

20 Claims, 4 Drawing Sheets

(d)

(e)

(f)

(g)

MULTILAYERED DIFFUSION BARRIER STRUCTURE FOR IMPROVING ADHESION PROPERTY

This application is a continuation-in-part of application Ser. No. 09/520,107, filed Mar. 7, 2000 now U.S. Pat No. 6,495,449.

FIELD OF THE INVENTION

This invention relates generally to integrated circuit processes and fabrication, and more particularly, to a method of improving the adhesion property of a diffusion barrier structure.

BACKGROUND OF THE INVENTION

The demand for progressively smaller, less expensive, and more powerful electronic products creates the need for smaller geometry integrated circuits (ICs), and large substrates. It also creates a demand for a denser packaging of circuits onto IC substrates. The desire for smaller geometry IC circuits requires that the dimension of interconnections between the components and the dielectric layers be as small as possible. Therefore, recent research continues to focus on reduction of the cross section area of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

There is a need for interconnects and vias to have low resistivity, and the ability to withstand volatile process environments. Aluminum and tungsten metals are often used in the production of integrated circuits for making interconnections or vias between electrically active areas. These metals have been used for a long time in the production environment because the processing technologies for these metals were available. Experience and expertise on these metals have also been acquired in the process due to the long-term usage.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also superior to those of aluminum. Copper is approximately ten times better than aluminum with respect to electromigration. As a result, a copper line, even one having a much smaller cross-section than an aluminum line, is better able to maintain electrical integrity.

However, there have been problems associated with the use of copper in IC processing. Copper poisons the active area of silicon devices, creating unpredictable responses. Copper also diffuses easily through many materials used in IC processes and, therefore, care must be taken to keep copper from migrating.

Various means have been suggested to deal with the problem of copper diffusion into integrated circuit materials. Several materials, including metals and metal alloys, have been suggested for use as barriers to prevent the copper diffusion process. The typical conductive diffusion barrier materials are TiN, TaN and WN. Addition of silicon into these materials, TiSiN, TaSiN, WSiN, could offer improvement in the diffusion barrier property. For non-conductive diffusion barrier, silicon nitride has been the best material so far. However, the adhesion of copper to these diffusion barrier materials has been, and continues to be, an IC process problem.

The conventional process of sputtering, used in the deposition of aluminum, will not work well when the geometry of the selected IC features are small. It is impractical to sputter metals, either aluminum or copper, to fill small diameter vias, since the gap filling capability is poor. Therefore new deposition processes have been used with diffusion barrier and copper in the lines and interconnects of an integrated circuit. To improve the gap fill capability, one of the techniques to deposit copper is the chemical vapor deposition (CVD) technique.

In a typical copper CVD process, copper is combined with a ligand, or organic compound, to make the copper volatile. That is, copper becomes an element in a compound, called precursor that is vaporized into a gas. Selected surfaces of an integrated circuit, such as that of diffusion barrier materials, are exposed to the copper gas in an elevated temperature environment. When the copper gas compound decomposes, copper is left behind on the selected surfaces. Several copper precursors are available for use with the CVD process. It is generally accepted that the configuration of the copper precursors, at least partially, affects the ability of the copper residue to adhere itself to the selected surfaces. Although certain precursors may improve the copper adhesion process, variations in the diffusion barrier surfaces to which the copper is applied, and variations in the copper precursors themselves, often result in unsatisfactory adhesion of copper to a selected surface.

Similarly, diffusion barrier materials could be deposited by the chemical vapor deposition technique. For example, in the case of TiN CVD deposition, a precursor that contains Ti and optionally nitrogen, is used. The precursor decomposes at the selected surfaces, and the decomposed elements react together to form a TiN layer on these selected surfaces. Precursor by-products (products formed as the precursor decomposes that do not participate in the reactions) and reaction by-products (products formed from the reaction that do not deposited on the selected surfaces) are often volatile and being exhausted away.

It has become a standard practice in the semiconductor industry to apply CVD copper immediately after the deposition of the diffusion barrier material to the integrated circuit to improve the adhesion and to reduce the contact resistance. Typically, the processes are performed in a single chamber or an interconnected cluster chamber. It has generally been thought that the copper layer has the best chance of adhering to the diffusion barrier material when the diffusion barrier material surface is clean and free of contaminants. Hence, the diffusion barrier surface is often kept under vacuum, or in a controlled environment, and the copper is deposited on the diffusion barrier as quickly as possible. However, even when copper is immediately applied to the diffusion barrier surface, problems remain in keeping the copper properly adhered.

Charneski et al., U.S. Pat. No. 5,909,637, entitled "Copper adhesion to a diffusion barrier surface and method for same", proposed a method to use reactive gas species to clean the surface of the diffusion barrier to improve the adhesion to the subsequently deposited copper layer. This method has very limited success and often does not provide enough adhesion to be practical. Nguyen et al., U.S. Pat. No. 5,913,144, entitled "Oxidized diffusion barrier surface for the adherence of copper and method for same", further proposed a method to use reactive oxygen species to oxidize the diffusion barrier surface to improve the adhesion to the subsequently deposited copper layer. This method works well to improve the adhesion property, but by oxidizing the barrier material, it produces a non-conductive layer that significantly increases the contact resistance of the integrated circuit even at a very small thickness.

It would be advantageous to understand the mechanism of the adhesion of CVD copper to a diffusion barrier material surface.

It would be advantageous to employ a method of improving the adhesion of CVD copper to a diffusion barrier material surface without increasing the contact resistance.

It would be advantageous to employ a method of improving the adhesion of CVD copper to a diffusion barrier material surface that can be optimized with respect to the contact resistance.

Accordingly, a method of improving the adhesion to the diffusion barrier surface is provided based on the analysis and understanding of the properties of the diffusion barriers. A good diffusion barrier, by definition, does not allow foreign materials to diffuse through. It also has poor chemical bonding with many foreign materials. It is not thermodynamically favorable for the diffusion barriers to bond with other materials because the resultant heat of formation is positive, that is, additional energies are required for these reactions. Therefore the adhesion property of good diffusion barrier materials based on chemical reaction is very poor. Deposition techniques that depend on chemical reactions to provide strong adhesion, such as chemical vapor deposition or electrochemical plating techniques, will be much more difficult to achieve good adhesion. In addition, copper material does not adhere well to many other materials, and thus adhesion of CVD copper to the diffusion barrier is even more difficult.

From thermodynamic arguments, good diffusion barriers for copper thus are those that have a positive heat of formation with copper. The nitrided metal diffusion barriers such as TiN, TaN, WN, TiSiN, TaSiN, WSiN, composed of mainly nitrogen and other metallic components such as Ti, Ta, W, offer the best conductive diffusion barrier property against copper diffusion. Copper nitrides have positive heats of formation so that it is thermodynamically unfavorable for copper to bond to nitrogen. These nitrides are more thermodynamically stable than copper nitrides and thus are effective against copper bonding and diffusion. Of all the mentioned nitrides, TiN and WN are similar to each other. TaN is a somewhat better barrier than either TiN or WN, and thus adhesion of CVD copper to TaN is much more difficult to achieve than to TiN or WN. The adhesion property of copper to an effective diffusion barrier however is poor.

To improve the adhesion of the nitrided metal diffusion barrier to copper, it is imperative to change the surface properties of the nitrided metal diffusion barrier layer. This surface should contain materials that bond with copper. Thermodynamically, it means that the compound from reactions of this material and copper should have a negative heat of formation, such as a copper oxide. One way to change the surface properties of the nitrided metal diffusion barrier thus is to form an oxy-nitride layer on the surface by oxy-nitriding the nitrided metal diffusion barrier layer surface, and the presence of oxygen in the oxy-nitride layer would promote the adhesion of copper to the diffusion barrier. The oxy-nitride layer comprises the metal, nitrogen, and oxygen, and serves to improve the adhesion of the multilayered diffusion barrier structure to the subsequently deposited layer. These atoms on the surface provide strong chemical bonding with the subsequent deposited layer and thus promote strong adhesion. The amount of oxygen in the oxy-nitride layer however has a strong effect on the contact resistance. The oxidizing condition will produce an oxide layer, however thin, that raises the contact resistance because of its non-conductive property. Care should be taken to avoid the extreme case of oxidizing the nitrided metal diffusion barrier that occurs by introducing an excessive amount of oxygen. One way to avoid over-oxidizing the nitrided metal barrier surface is to introduce a small amount of oxy-nitride contained gas or a precursor that contains oxygen and nitrogen to the barrier surface. The introduction of the oxy-nitride or oxygen-nitrogen combination reduces oxidizing of the surface. Therefore a method to improve the adhesion of the nitrided metal diffusion barrier without introducing a non-conductive oxide layer is to have a multilayer: a nitrided metal diffusion barrier layer to block foreign material diffusion, and a thin oxy-nitrided metal layer to provide the adhesion property. The oxygen content in this oxy-nitrided layer is small such that the nitrided metal layer is not oxidized and results in a non-conductive layer.

In the oxy-nitriding process, the metal comes from the nitrided metal diffusion barrier layer, oxygen comes from the ambient, and nitrogen can be from the nitrided metal diffusion barrier layer and the ambient. There are different ways of incorporating the metal, oxygen, nitrogen to form the oxy-nitride layer. One way is to introduce a small amount of oxygen to a thin surface of the nitrided metal diffusion barrier. To provide a thin oxy-nitrided metal layer such as TiON, TiSiON, TaON, TaSiON, WON, WSiON, the nitrided metal diffusion barrier surface is oxy-nitrided in an oxygen-contained ambient. The oxy-nitrided metal adhesion property improvement is most effective with TiN, a less effective diffusion barrier, and much less effective with TaN, a more effective diffusion barrier. This method uses the nitrogen from the nitrided diffusion barrier layer. Another way is to introduce oxygen and nitrogen from an ambient. Additional nitrogen thus comes from the ambient source. Another way is to deposit a thin oxy-nitride metal diffusion barrier layer by using an oxygen/nitrogen precursor together with the precursors needed to deposit the nitrided metal diffusion barrier. Not all oxy-nitrided materials however exhibit good adhesion property.

Cleaning the diffusion barrier, a method proposed by Charneski et al., in U.S. Pat. No. 5,909,637 has a very limited success because it does not change the fundamental properties of the diffusion barrier surface.

Oxidizing the diffusion barrier, a method proposed by Nguyen et al., in U.S. Pat. No. 5,913,144, is a proper method of improving the adhesion property. However, the improvement in adhesion is offset by the introduction of a non-conductive oxide layer with the use of reactive oxygen species from a predominantly oxygen plasma. Nguyen et al.'s method solved the high contact resistance problem related to the non-conductive oxide layer by limiting the thickness of this layer to less than 3 nm and relying on the tunneling phenomenon to provide the conduction path.

An improved method to improve adhesion without increasing the contact resistance is to form a multilayer with selected areas being removed to improve the contact resistance: a nitrided metal diffusion barrier layer and a thin oxidized nitrided metal layer with the thin oxidized nitrided metal layer being removed at selected areas to improve the contact resistance. In a typical structure, the oxidized layer is removed from the top and bottom of the structure to improve the contact resistance. The oxidized layer remains at the sidewall of the structure to improve the adhesion.

Accordingly, a method to improve the adhesion property of copper to the nitrided metal diffusion barriers such as TiN, TiSiN, TaN, TaSiN, WN, WSiN, by forming a multilayered diffusion barrier structure is provided. The provided multilayered diffusion barrier is deposited on an underlayer, and provides improved adhesion between the underlayer and a subsequently deposited conducting layer while maintain electrical conduction to the subsequently deposited conducting layer. The method comprises the steps of:

a) Depositing a conducting metal nitrided diffusion barrier layer on the underlayer, whereby this diffusion barrier layer serves as a barrier between the underlayer and the subsequently deposited layer;

b) Forming a poorly electrical conducting adhesion-promoter layer on top of the conducting diffusion barrier layer, whereby this adhesion-promoter layer serves to improve the adhesion of the multilayered diffusion barrier structure to the subsequently deposited;

c) Removing the adhesion-promoter layer at selected predetermined locations to increase the electrical conduction to the subsequently deposited layer.

The two layers, nitrided metal diffusion barrier layer and the adhesion-promoter layer, and the partial removal of the second adhesion promoter layer are formed in sequence. The three steps can be formed in one, two or three process chambers. The formation of these two layers can occur in two separate locations, two process chambers in the same process equipment, or in two separate process equipment. The formation of the nitrided metal diffusion barrier can occur in the first process chamber (of the two chamber equipment), or in the first process equipment. The substrate will then be moved to the second process chamber (of the two chamber equipment), or to the second process equipment for the adhesion-promoter process. The partial removal of the adhesion-promoter layer at selected locations can occur in a third process chamber. The adhesion promoter layer can be an oxidized nitrided metal layer, or an oxy-nitride metal layer. The oxy-nitride metal layer comprises the metal, oxygen and nitrogen in such compositions to provide good adhesion and higher conductivity than oxidized nitrided metal material. Such adhesion-promoter process can require an oxygen-contained ambient. In some aspects of the invention, an elevated temperature is also provided. The elevated temperature ranges from 200° C. to 1200° C., with 300–500° C. being a typical temperature range. The oxidizing or oxy-nitriding time ranges from a few seconds to several minutes, depending on many factors such as the optimization of process flow, the optimization of the desired level of adhesion, the optimization of contact resistance, etc. In some aspects of the invention, oxygen in excited state is provided to promote the reaction between the oxygen and the nitrided metal layer. The oxygen can be excited by a remote plasma system, a plasma system, or an ozone generator to provide oxygen in ozone state.

In some aspects of the invention, the nitrided metal diffusion barrier is selected from a group consisting of TiN, TiSiN, TaN, TaSiN, WN, WSiN.

The method also provides that the poorly conducting adhesion promoter layer is non-conducting, meaning with a resistivity higher than $10^5$ Ohm-m. A good conducting material, such as copper, has a resistivity in the range of $10^{-8}$ Ohm-m. A semiconductor has resistivity in the range of $10^{-2}$ to $10^3$ Ohm-m. A non-conducting material has resistivity in the range of $10^5$ to $10^{14}$ Ohm-m. The method also provides that the non-conducting adhesion-promoter layer is the oxidized nitrided metal material. The presence of a non-conducting adhesion-promoter layer does not affect significantly the contact resistance because this high resistance layer will be partially removed in step c in selected locations to reduce the contact resistance.

The method also provides that the poorly conducting adhesion promoter layer has an electrical conductance that is less than that of the conducting diffusion barrier, or the resistivity of the poorly conducting adhesion promoter layer is more than that of the conducting diffusion barrier. The lower the resistivity of the adhesion-promoter layer, the easier it will be for the removal process, because it will mean less removal of the adhesion-promoter layer and still provide adequate contact resistance. The method also provides an oxy-nitrided metal layer such as a metal nitrogen-rich oxy-nitrided layer for an adhesion-promoter with low resistivity.

The method also provides that the adhesion promoter layer has an electrical conductance that is better than that of the conducting diffusion barrier, or the resistivity of the poorly conducting adhesion promoter layer is lower than that of the conducting diffusion barrier. The method also provides a metal layer as an adhesion-promoter that has lower resistivity than the conducting diffusion barrier.

The method also provides the formation of the adhesion-promoter layer by reaction of the nitrided metal diffusion barrier with various precursors such as oxygen-contained ambient. To provide a thin oxy-nitrided metal layer, an ambient comprising the oxygen species is needed. The oxygen species can be oxygen gas, $N_2O$, $NO_2$ gas, water vapor, alcohol vapor, OH ligand, chemicals containing OH ligand, chemicals releasing OH ligand upon high temperature annealing. The oxygen species can also be diluted in other gases.

The method also provides the reactive oxygen species by plasma source to oxy-nitriding the nitrided metal diffusion barrier layer. The plasma source can be a direct plasma source or a downstream plasma source. In some aspects of the invention, the nitrided metal diffusion barrier is deposited by plasma-enhanced chemical vapor deposition. In this case, the underlayer is exposed to plasma energies of the diffusion barrier precursors. At the end of the deposition, the diffusion barrier precursors are turned off, and an oxygen-contained ambient is introduced. The presence of the oxygen plasma will incorporate some oxygen into the nitrided metal diffusion barrier to form the metal oxy-nitride metal layer.

The method also provides an alternate way to oxy-nitriding the nitrided metal diffusion barrier layer. In the case of the high temperature nitrided metal diffusion barrier deposition process, the oxy-nitriding process occurs during the cooling down period of the diffusion barrier formation. The oxy-nitriding process is then independent of time, i.e. self-limiting, and requires no external heating source, i.e. self-annealing process. A preferred method to achieve this process is to move quickly the deposited hot nitrided metal diffusion barrier to an oxygen-contained ambient where the nitrided metal diffusion barrier is annealed in an oxygen-contained ambient by its own thermal energy. The oxygen-contained ambient could be the atmosphere where the oxygen concentration is about 21%. Most nitrided metal diffusion barrier process requires high temperature, thus this method is applicable to most cases. For example, sputtered TiN deposited at 300° C., and TiN CVD occurs at 300–450° C.

In some aspects of the invention, the formation of the metal oxy-nitride layer further comprises variations in the nitrided metal diffusion barrier process such as diffusion barrier precursor flow, substrate temperature, precursor temperature, plasma power, and chamber pressure. In the deposition of the nitrided metal diffusion barrier layer, the process conditions are optimized to produce the best diffusion barrier properties. These process conditions are not necessarily best suitable for the adhesion purpose. Therefore the metal oxy-nitride layer deposition process conditions will require modifications of the nitrided metal diffusion barrier process conditions to optimize the desired adhesion feature of this layer.

The current invention also provides another method to deposit the multilayered diffusion barrier structure. In this aspect of the invention, the adhesion-promoter layer is formed by deposition. The adhesion-promoter layer in this method is being deposited instead of growth. In the growth process, the oxygen diffuses into the nitrided metal diffusion barrier and the nitrided metal diffusion barrier grows outward and becomes an oxy-nitride. The thickness of this oxy-nitride layer depends on the amount of oxygen, its energy, growth time. In the deposition process, the metal oxy-nitride layer is deposited directly on the substrate. The oxygen is combined with the diffusion barrier precursors, and as a result the metal oxy-nitride layer is formed on the surface of the diffusion barrier layer.

The method also provides various techniques to deposit the nitrided metal diffusion barrier. The evaporation technique can deliver the nitrided metal diffusion barrier by heating the source material. The sputtering technique can deliver the nitrided metal diffusion barrier by sputtering a target in a nitrogen-contained ambient. TiN diffusion barrier can be formed using a Ti target. Or by using a TiN target, the sputtering technique can deliver TiN without the need for the additional nitrogen ambient. The sputtering technique however does not fill the gap very well. The chemical vapor deposition technique can deliver the nitrided metal diffusion barrier by using appropriate precursors. Typical TiN liquid precursors are tetrakisdimethylaminetitanium (TDMAT), tetrakisdiethylaminetitanium (TDEAT), and tetrakismethyl-ethylaminetitanium (TMEAT). These precursors can be combined with a nitrogen source such as ammonia ($NH_3$), or nitrogen. Typical TaN liquid precursors include pentadiethylaminetantalum (PDMAT), that can be used with or without a nitrogen source. Typical WN chemical vapor deposition uses a precursor such as $WF_6$ with nitrogen. The addition of other materials such as silicon can produce ternary nitrided metal diffusion barriers such as TiSiN, TaSiN, or WSiN. To further excite the precursors, additional energies from a plasma source can be added as in the technique of plasma-enhanced chemical vapor deposition. The deposition technique can also include atomic layer deposition (ALD) process, where a first precursor is adsorbed on the substrate surface and then reacted with a second precursor, introduced at a later time.

The current invention also provides a method to form the multilayered diffusion barrier structure in the same process chamber without the need to move the substrate between growth of the layers of the multilayered diffusion barrier structure. Both the nitrided metal diffusion barrier layer and the adhesion-promoter layers are formed in the same processing chamber. After completion of the nitrided metal diffusion barrier layer, oxygen-contained ambient is introduced and the layer is oxy-nitrided to form the adhesion-promoter layer. A bias is then applied and the adhesion-promoter layer is removed in selected locations to provide good contact resistance to the subsequently deposited layer.

The method also provides the selected removal of the adhesion-promoter layer by directional etching. The directional etching technique removes materials in the line of sight and leaves the materials out of sight alone. The directional etching will etch away the materials in the bottom and top areas, and not etch the materials in the sidewall.

The directional etching can be established by setting an electric field in a plasma environment. The charged particles in the plasma will move directionally under the electric field. By generating a plasma and then applied a bias source to the substrate, an electric field is established to generate a directional etching. Another way of directional etching is to provide the kinetic energy to etching particles such as sputtering technique.

The method also provides for a complete removal of the adhesion-promoter layer. The presence of the adhesion-promoter layer serves to improve the adhesion, but could increase the contact resistance. The complete removal of the adhesion-promoter layer at selected areas serves to ensure that the contact resistance will not be affected by the presence of the adhesion-promoter layer. The method also provides for a partial removal of the adhesion-promoter layer. If the adhesion-promoter layer is conductive enough, partial removal will be adequate to achieve good contact resistance, while maintaining better adhesion.

The method also provides for a removal of the adhesion-promoter layer at the areas directly on top of the bottom contacts. In typical interconnection scheme, the bottom metal lines connect to the top metal lines through the bottom contacts. By removing the adhesion-promoter layer at these areas, the contact resistance is minimized.

The method also provides a further step of depositing copper on the multilayered diffusion barrier structure, whereby the copper is adhered to a material which prevents the diffusion of copper into regions of the IC underlying the diffusion barrier. In another aspect of the invention, the copper is deposited using chemical vapor deposition technique. Other techniques to deposit copper include electrochemical plating.

An integrated circuit is provided having the first underlayer. This first underlayer could be the source, drain or gate region of the active devices. Optimization could provide also a contact scheme such as silicide contact to improve the contact resistance. This first underlayer could also be the first metal region such as copper interconnect or via. On the first underlayer is the multilayered diffusion barrier that comprises a nitrided metal diffusion barrier and a thin metal oxy-nitride layer. On the multilayered diffusion barrier is a second metal layer such as copper interconnect or via. The second metal layer is connected electrically to the first underlayer or the first metal layer through the multilayered diffusion barrier. The second metal layer cannot diffuse to the first underlayer due to the presence of the multilayered diffusion barrier.

The method also provides a further step of depositing copper on the multilayered diffusion barrier structure, whereby the copper is adhered to a material which prevents the diffusion of copper into regions of the IC underlying the diffusion barrier. In another aspect of the invention, the copper is deposited using chemical vapor deposition technique. Other techniques to deposit copper include electrochemical plating.

In another embodiment, the method provides for a general conducting diffusion barrier, not just nitrided metal diffusion barrier. A metal such as tungsten, chromium, iridium can serve as a conducting diffusion barrier material. A silicide such as cobalt silicide, titanium silicide, nickel silicide can also serve as a conducting diffusion barrier. And the poorly conducting adhesion-promoter layer can be of any material exhibiting poorly conducting property, such as silicon nitride, silicon oxide.

In another embodiment, the present invention provides for a multilayer diffusion barrier structure. The multilayer diffusion barrier structure comprises a conducting diffusion barrier layer and a poorly conducting adhesion-promoting layer on the sidewall of an interconnect structure.

DETAILED DESCRIPTION OF THE PREFERRED EMBODIMENT

Figure 1:
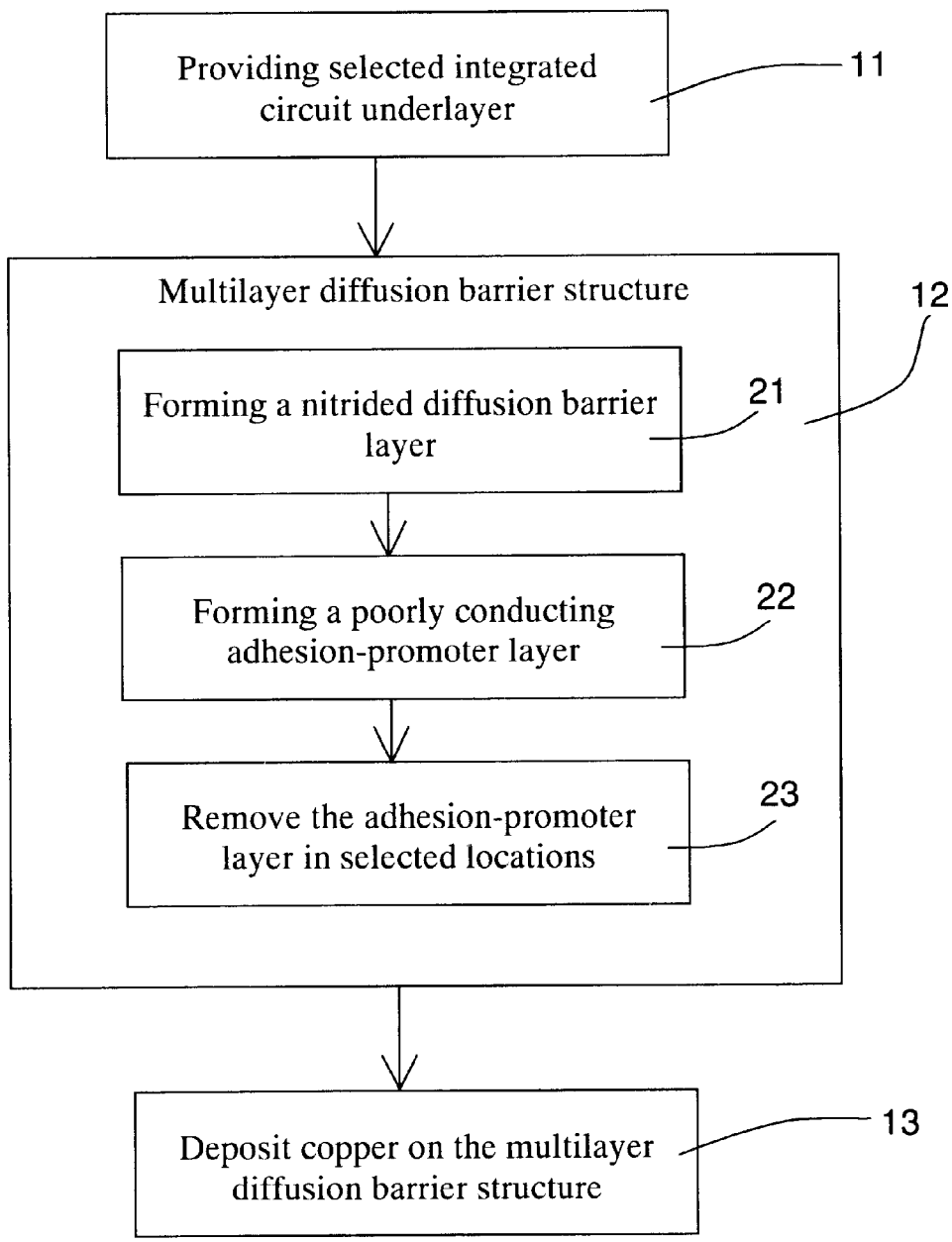
FIG. 1 is a flowchart showing steps in the method of using the multilayered diffusion barrier structure in an integrated circuit processing.

FIG. 1 is a flowchart showing steps in the method of using the multilayered diffusion barrier structure in an integrated circuit processing. Step 11 provides selected integrated circuit underlayer. Step 12 provides the multilayered diffusion barrier structure. Step 12 composes of 3 steps, step 21, 22 and 23. Step 21 provides the nitrided diffusion barrier layer and step 22 provides the poorly conducting adhesion-promoter layer. Step 23 provides the removal of the poorly conducting adhesion-promoter layer in selected locations. Step 13 provides the copper layer with improved adhesion to the nitrided diffusion barrier layer.

Figure 2:
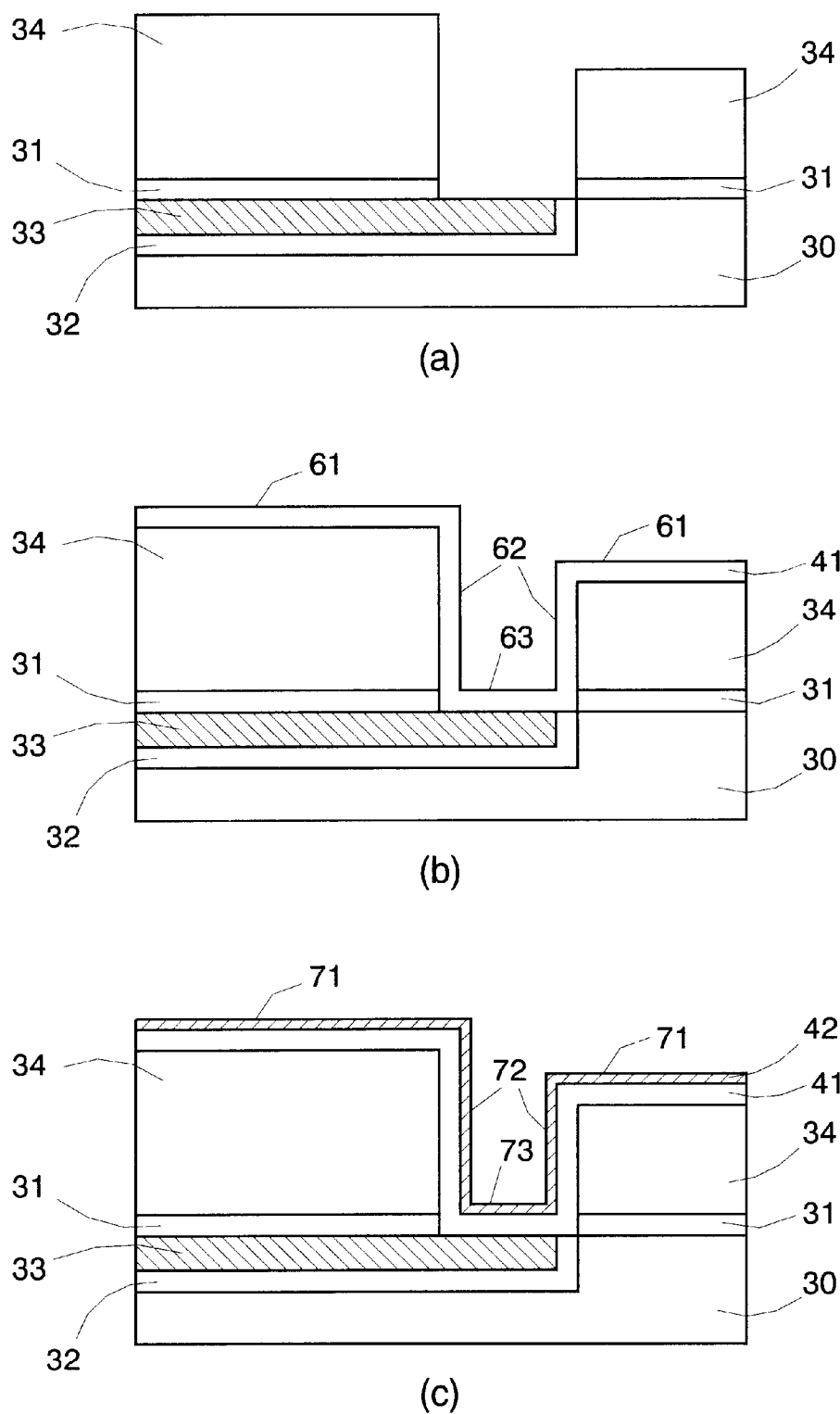
FIGS. 2a–2g show the schematic of the multilayered diffusion barrier structure in an integrated circuit environment.
Figure 2:
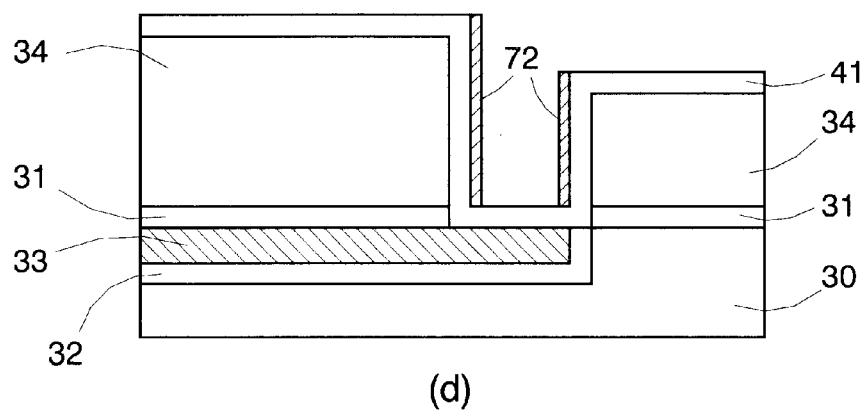
Figure 2:
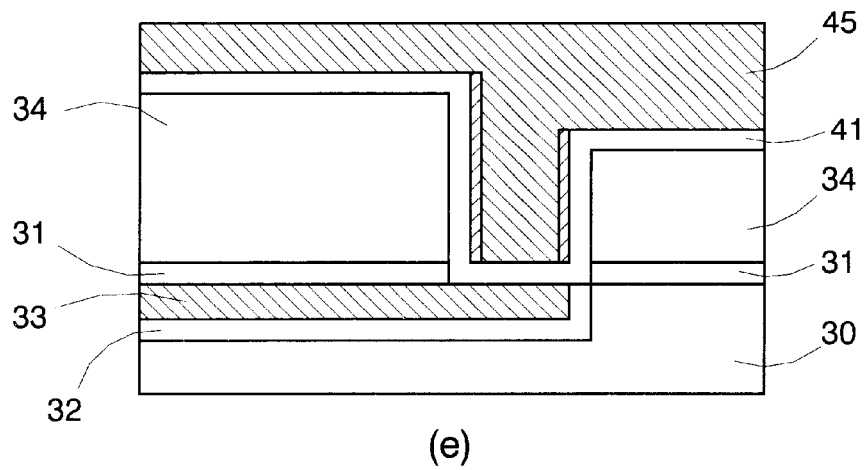
Figure 2:
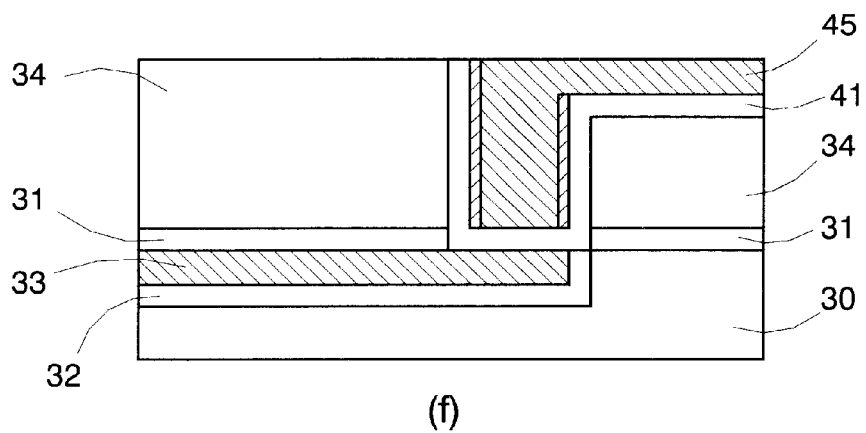
Figure 2:
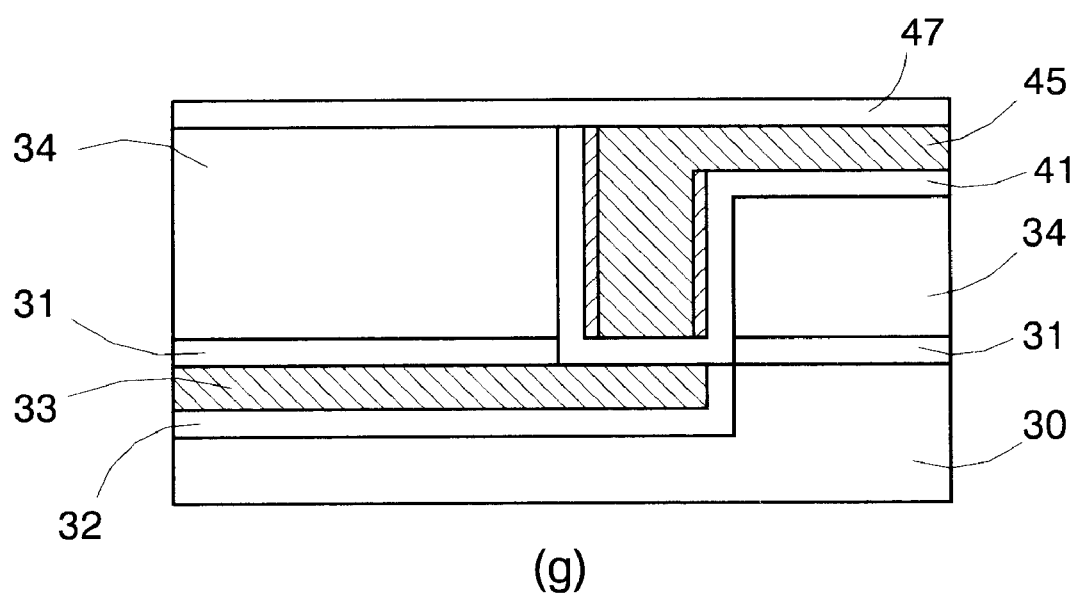

FIG. 2 shows the process flow of the multilayered diffusion barrier structure in an integrated circuit environment resulted from the flowchart in FIG. 1. FIG. 2a shows a typical interconnect underlayer. The underlayer comprises a bottom dielectric layer 30 with a bottom conducting line 33 and a top dielectric layer 34 with a partial opening to expose the bottom conducting line 33 for electrical conduction from the bottom conducting line 33 to a top conducting line 45 (to be deposited later, FIGS. 2e–g). Layers 32 and 31 are diffusion barrier layers. Layer 31 is a nonconducting diffusion barrier layer to prevent short circuit of the bottom conducting line 33 to everywhere. Layer 32 can be electrical conducting or non-conducting, with conducting is preferred to increase the size of the conduction line and carry more current.

FIG. 2b shows the first step of depositing a conducting diffusion barrier 41. The diffusion barrier 41 needs to be conducting for connecting the bottom conducting line 33 to the top conducting line 45 (to be deposited later, FIGS. 2e–g). Adhesion of the conducting diffusion barrier to the underlayer is normally not a problem. The problem is the adhesion of the subsequently deposited conducting layer on top of the diffusion layer to the diffusion layer, mainly on the top surface 61, bottom surface 63 and sidewall surface 62 of the diffusion barrier layer. Typical diffusion barriers for semiconductor interconnect are TiN, TiSiN, TaN, TaSiN, WN, WSiN, using for copper interconnect and aluminum interconnect.

FIG. 2c shows the second step of forming a poorly conducting adhesion-promoter layer 42 on the diffusion barrier 41. The purpose of the adhesion-promoter layer 42 is to serve as a glue layer between the diffusion barrier layer 41 and the subsequently deposited conducting layer 45. The choice of a poorly conducting material for the adhesion-promoter layer 42 is a practical one. From an electrical conduction purpose, a highly conducting material is a better choice for a glue layer since it will not inhibit the electrical current flow from the bottom conducting layer to the top conducting layer. However, other considerations make this choice impractical, such as the conducting glue layer might form an alloy with the conducting line, the difficulties involved in forming such a conducting adhesion-promoter layer. Oxidizing the diffusion barrier to form a oxidized or an partially oxidized layer on top of the diffusion layer is a simple and fast way to modify the surface of the diffusion barrier to change the adhesion characteristics. Similar to the diffusion barrier surface, the adhesion-promoter surface also includes top surfaces 71, bottom surface 73 and sidewall surfaces 72.

FIG. 2d shows the third step of removal the adhesion-promoter layer in selected locations. The bottom surface 73 of the adhesion-promoter layer is directly on top of the bottom contact surface 63 of the diffusion barrier layer, and is the main area to be removed for good conduction with the bottom conducting line. Using directional etching, the top surfaces 71 of the adhesion-promoter layer are also being removed and leaving only the sidewall surfaces 72. The removal of the top surfaces 71 is not required for the electrical conduction, and can reduce somewhat the adhesion-promotion property. However, since the sidewall adhesion is often the most critical aspect, the presence of sidewall surfaces 72 will be adequate to maintain good adhesion between the diffusion barrier layer 41 and the subsequently deposited layer 45. In the case of the adhesion-promoter layer having adequate electrical conductivity, a complete removal of the adhesion-promoter layer as shown in FIG. 2d is not necessary. A partial removal of the adhesion-promoter layer will increase the adhesion property without significantly degrade the conduction property. FIG. 2d also shows a preferred embodiment of the present invention multilayer diffusion barrier structure. The multilayer diffusion barrier structure comprises a diffusion barrier layer 41 to block the diffusion of material from the subsequently deposited layer 45 into the underlayer. The multilayer diffusion barrier structure further comprises a poorly conducting adhesion-promoter layer on the sidewall surfaces 62 of the diffusion barrier 41 to improve the adhesion of the subsequently deposited layer 45 to the diffusion barrier layer 41, while not degrading the electrical conductivity between the bottom conducting line 33 and the top conducting line 45.

FIG. 2e shows the structure after the subsequently deposited layer 45 has been deposited. FIG. 2f shows the planarization of the layer 45 and FIG. 2g shows the deposition of a cap layer 47. The adhesion of the top conducting layer 45 to the diffusion barrier layer 41 is enhanced by the presence of the adhesion-promoter layer on the sidewall surfaces 72.

What is claimed is:

1. A method to form a multilayered diffusion barrier structure on an underlayer for improving adhesion between the underlayer and a subsequently deposited conducting layer while maintain electrical conduction to the subsequently deposited conducting layer, the method comprises the steps of:

a) Depositing a conducting metal nitrided diffusion barrier layer on the underlayer, whereby this diffusion barrier layer serves as a barrier between the underlayer and the subsequently deposited layer;

b) Forming a poorly electrical conducting adhesion-promoter layer on top of the conducting diffusion barrier layer, whereby this adhesion-promoter layer serves to improve the adhesion of the multilayered diffusion barrier structure to the subsequently deposited layer;

c) Removing the adhesion-promoter layer at selected predetermined locations to increase the electrical conduction to the subsequently deposited layer.

2. A method as in claim 1 in which the nitrided metal diffusion barrier layer is selected from a group consisting of TiN, TiSiN, TaN, TaSiN, WN, WSiN.

3. A method as in claim 1 in which the poorly electrical conducting adhesion-promoter layer is non-conducting.

4. A method as in claim 1 in which the poorly electrical conducting adhesion-promoter layer is a thin oxidized nitrided metal layer.

5. A method as in claim 1 in which the electrical conductivity of the poorly electrical conducting adhesion-promoter layer is less than that of the conducting diffusion barrier.

6. A method as in claim 1 in which the poorly electrical conducting adhesion-promoter layer is a thin metal nitrogen-rich oxy-nitrided layer.

7. A method as in claim 1 in which the adhesion-promoter layer is formed by exposing the diffusion barrier surface to an oxygen-contained ambient.

8. A method as in claim 7 in which the exposure of the diffusion barrier surface to an oxygen-contained ambient occurs in an elevated temperature environment.

9. A method as in claim 7 in which the oxygen in the oxygen-contained ambient is exposed to a plasma source.

10. A method as in claim 7 in which the oxygen in the oxygen-contained ambient is in excited state.

11. A method as in claim 7 in which the oxygen in the oxygen-contained ambient is selected from a group consisting of $O_2$, $N_2O$, $NO_2$, air, water vapor, alcohol vapor, OH ligand, chemicals containing OH ligand, chemicals releasing OH ligand upon annealing.

12. A method as in claim 1 in which the poorly electrical conducting adhesion-promoter layer is formed by thin film deposition.

13. A method as in claim 12 in which the deposition technique is chemical vapor deposition, plasma enhanced chemical vapor deposition, physical vapor deposition, evaporation, electrochemical deposition, atomic layer deposition.

14. A method as in claim 1 in which the removing step is performed by directional etching.

15. A method as in claim 1 in which the removing step removes completely the adhesion-promoter layer.

16. A method as in claim 1 in which the removing step removes partially the adhesion-promoter layer.

17. A method as in claim 1 in which the predetermined locations are directly on top of the bottom contacts of the diffusion barrier layer.

18. A method as in claim 1 comprises a further step, after step c):

d) Depositing the subsequently deposited conducting layer.

19. A method to form a multilayered diffusion barrier structure on an underlayer for improving adhesion between the underlayer and a subsequently deposited conducting layer while maintain electrical conduction to the subsequently deposited conducting layer, the method comprises the steps of:

a) Depositing a conducting diffusion barrier layer on the underlayer, whereby this diffusion barrier layer serves as a barrier between the underlayer and the subsequently deposited layer;

b) Forming a poorly electrical conducting adhesion-promoter layer on top of the conducting diffusion barrier layer, whereby this adhesion-promoter layer serves to improve the adhesion of the multilayered diffusion barrier structure to the subsequently deposited layer;

c) Removing the adhesion-promoter layer at selected predetermined locations to increase the electrical conduction to the subsequently deposited layer.

20. A multilayered diffusion barrier structure on a step underlayer for improving adhesion between the underlayer and a subsequently deposited conducting layer while maintain electrical conduction to the subsequently deposited conducting layer, the multilayered diffusion barrier structure comprises:

a) A conducting diffusion barrier layer, whereby this diffusion barrier layer serves as a barrier between the underlayer and the subsequently deposited layer;

b) A poorly electrical conducting adhesion-promoter layer on the conducting diffusion barrier layer on the sidewall of the step of the underlayer, whereby this adhesion-promoter layer serves to improve the adhesion of the multilayered diffusion barrier structure to the subsequently deposited layer and not to reduce the electrical conduction to the subsequently deposited layer.

\* \* \* \* \*